(12) United States Patent
Chen et al.

(10) Patent No.: US 11,309,468 B2
(45) Date of Patent: Apr. 19, 2022

(54) METHOD OF FABRICATING MICRO LIGHT EMITTING DIODE ARRAY SUBSTRATE, MICRO LIGHT EMITTING DIODE ARRAY SUBSTRATE, MICRO LIGHT EMITTING DIODE DISPLAY APPARATUS

(71) Applicants: Hefei Xinsheng Optoelectronics Technology Co., Ltd., Anhui (CN); BOE Technology Group Co., Ltd., Beijing (CN)

(72) Inventors: Peng Chen, Beijing (CN); Xinxia Zhang, Beijing (CN); Hengbin Li, Beijing (CN); Guolei Wang, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 385 days.

(21) Appl. No.: 16/484,807

(22) PCT Filed: Nov. 27, 2018

(86) PCT No.: PCT/CN2018/117703
§ 371 (c)(1),
(2) Date: Aug. 8, 2019

(87) PCT Pub. No.: WO2020/107216
PCT Pub. Date: Jun. 4, 2020

(65) Prior Publication Data
US 2021/0367119 A1 Nov. 25, 2021

(51) Int. Cl.
*H01L 33/62* (2010.01)
*H01L 27/15* (2006.01)
(Continued)

(52) U.S. Cl.
CPC ............ *H01L 33/62* (2013.01); *H01L 27/156* (2013.01); *H01L 33/005* (2013.01); *H01L 33/34* (2013.01);
(Continued)

(58) Field of Classification Search
CPC ..... H01L 33/62; H01L 27/156; H01L 33/005; H01L 33/34; H01L 33/38; H01L 2933/0016; H01L 2933/0066
See application file for complete search history.

(56) References Cited

U.S. PATENT DOCUMENTS 10,325,894 B1 * 6/2019 Pan .................. H01L 27/156
2014/0291688 A1 * 10/2014 Tsang .............. H01L 27/1218
257/72

(Continued)

*Primary Examiner* — Su C Kim
(74) *Attorney, Agent, or Firm* — Intellectual Valley Law, P.C.

(57) ABSTRACT

A method of fabricating a micro light emitting diode (micro LED) array substrate having a plurality of micro LEDs. The method includes forming a plurality of signal lines on a base substrate; depositing a semiconductor material on the base substrate to form a semiconductor material layer; and patterning the semiconductor material layer to form a semiconductor layer of the plurality of micro LEDs. A surface of the plurality of signal lines away from the base substrate is uncovered during depositing the semiconductor material. The plurality of signal lines form a grid for facilitating epitaxial growth of the semiconductor material.

19 Claims, 8 Drawing Sheets

(51) Int. Cl.
*H01L 33/00* (2010.01)
*H01L 33/34* (2010.01)
*H01L 33/38* (2010.01)

(52) U.S. Cl.
CPC ...... *H01L 33/38* (2013.01); *H01L 2933/0016* (2013.01); *H01L 2933/0066* (2013.01)

(56) References Cited

U.S. PATENT DOCUMENTS

2014/0353698 A1\* 12/2014 Chen .................. H01L 33/0093
257/94
2017/0179192 A1\* 6/2017 Zhang .................. H01L 25/075

\* cited by examiner

METHOD OF FABRICATING MICRO LIGHT EMITTING DIODE ARRAY SUBSTRATE, MICRO LIGHT EMITTING DIODE ARRAY SUBSTRATE, MICRO LIGHT EMITTING DIODE DISPLAY APPARATUS

CROSS-REFERENCE TO RELATED APPLICATION

This application is a national stage application under 35 U.S.C. § 371 of International Application No. PCT/CN2018/117703, filed Nov. 27, 2018, the contents of which are incorporated by reference in the entirety.

TECHNICAL FIELD

The present invention relates to display technology, more particularly, to a method of fabricating a micro light emitting diode array substrate, a micro light emitting diode array substrate, and a micro light emitting diode display apparatus.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides a method of fabricating a micro light emitting diode (micro LED) array substrate having a plurality of micro LEDs, comprising forming a plurality of signal lines on a base substrate; depositing a semiconductor material on the base substrate to form a semiconductor material layer; and patterning the semiconductor material layer to form a semiconductor layer of the plurality of micro LEDs; wherein a surface of the plurality of signal lines away from the base substrate is uncovered during depositing the semiconductor material, the plurality of signal lines forming a grid for facilitating epitaxial growth of the semiconductor material.

Optionally, prior to forming the plurality of signal lines, the method further comprises forming a growth layer on the base substrate, the epitaxial growth of the semiconductor material being formed on the growth layer.

Optionally, the method further comprises forming a plurality of thin film transistors on the base substrate for respectively driving light emission of the plurality of micro LEDs; wherein each of the plurality of thin film transistors is formed to comprise an active layer; and the growth layer and the active layer are formed in a same layer using a same material, and in a single patterning process using a single mask plate.

Optionally, each of the plurality of thin film transistors is formed to comprises a source electrode and a drain electrode; and the source electrode, the drain electrode, and the plurality of signal lines are formed in a same layer using a same material, and in a single patterning process using a single mask plate.

Optionally, subsequent to forming the active layer and the growth layer and prior to forming the plurality of signal lines, the source electrode, and the drain electrode, the method further comprises forming an insulating layer on a side of the active layer and the growth layer away from the base substrate; and forming a first via, a second via, and a third via respectively extending through the insulating layer; wherein the source electrode is formed to be connected to the active layer through the first via; and the drain electrode is formed to be connected to the active layer through the second via and connected to the growth layer through the third via.

Optionally, the growth layer and the active layer are formed using a material comprising silicon.

Optionally, subsequent to patterning the semiconductor material layer to form the semiconductor layer of the plurality of micro LEDs, the method further comprises forming a pixel definition layer defining a plurality of subpixel apertures; and forming a contact pad layer on a side of the semiconductor layer away from the base substrate.

Optionally, the plurality of signal lines are a plurality of data lines of the micro LED array substrate.

Optionally, the semiconductor layer of the plurality of micro LEDs is selected from a group consisting of an n-layer, a p-layer, and a multiple quantum well layer of the plurality of micro LEDs.

In another aspect, the present invention provides a micro light emitting diode (micro LED) array substrate having a plurality of micro LEDs, comprising a base substrate; a growth layer on the base substrate; a plurality of semiconductor layers of the plurality of micro LEDs on a side of the growth layer away from the base substrate; and a plurality of thin film transistors on the base substrate; wherein each of the plurality of thin film transistors comprises an active layer; and the growth layer and the active layer are in a same layer and comprise a same semiconductor material.

Optionally, the micro LED array substrate further comprises an insulating layer on a side of the growth layer and the active layer away from the base substrate; and a plurality of signal lines on a side of the insulating layer away from the base substrate.

Optionally, each of the plurality of thin film transistors comprises a source electrode and a drain electrode; and the source electrode, the drain electrode, and the plurality of signal lines are in a same layer and comprise a same material.

Optionally, the micro LED array substrate further comprises a first via, a second via, and a third via respectively extending through the insulating layer; wherein the source electrode is connected to the active layer through the first via; and the drain electrode is connected to the active layer through the second via and connected to the growth layer through the third via.

Optionally, the micro LED array substrate further comprises a pixel definition layer defining a plurality of subpixel apertures on a side of the plurality of signal lines away from the base substrate, the plurality of semiconductor layers being in the plurality of subpixel apertures; wherein the pixel definition layer is in direct contact with at least one of the plurality of semiconductor layers of the plurality of micro LEDs; and the pixel definition layer is in direct contact with the plurality of signal lines.

Optionally, an upper surface of the plurality of signal lines away from the base substrate are in direct contact with the pixel definition layer; and an upper most surface of the plurality of semiconductor layers of the plurality of micro LEDs is in direct contact with the pixel definition layer.

Optionally, the plurality of semiconductor layers in each of the plurality of subpixel apertures has a cross-section along a plane perpendicular to a main surface of the base substrate; the cross-section has a first side away from the base substrate and a second side opposite to the first side and facing the base substrate; and the first side is wider than the second side in each of the plurality of subpixel apertures.

Optionally, the micro LED array substrate further comprises a contact pad layer on a side of the plurality of semiconductor layers away from the base substrate.

Optionally, the growth layer and the active layer comprise a material comprising silicon.

Optionally, the plurality of signal lines are a plurality of data lines of the micro LED array substrate.

In another aspect, the present invention provides a micro light emitting diode (micro LED) display apparatus, comprising the micro LED array substrate described herein or fabricated by a method described herein, and one or more integrated circuits connected to the micro LED array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In fabricating a micro light emitting diode (micro LED) display panel, each of the micro LED has to be transferred from a growth substrate to an array substrate. Considering the display panel includes thousands to millions of micro LEDs, a pick-and-place transfer process is extremely time-consuming, and thus not suitable for large-scale fabrication of micro LED display panels. An improvement to the pick-and-place transfer is to use a printing head for transferring a plurality of micro LEDs at one time. Still, a process of transferring a large number of micro LEDs using a printing head is too complicated and time-consuming. Moreover, misalignment between the micro LEDs and the bonding contacts in the target substrate occurs frequently in the pick-and-place transfer or the transfer process using a printing head, resulting in defects in the display panel.

Accordingly, the present disclosure provides, inter alia, a method of fabricating a micro light emitting diode (micro LED) array substrate having a plurality of micro LEDs, a micro light emitting diode array substrate having a plurality of micro LEDs, and a micro light emitting diode display apparatus that substantially obviate one or more of the problems due to limitations and disadvantages of the related art. In one aspect, the present disclosure provides a method of fabricating a micro light emitting diode array substrate having a plurality of micro LEDs. In some embodiments, the method includes forming a plurality of signal lines on a base substrate; depositing a semiconductor material on the base substrate to form a semiconductor material layer; and patterning the semiconductor material layer to form a semiconductor layer of the plurality of micro LEDs. A surface of the plurality of signal lines away from the base substrate is uncovered during depositing the semiconductor material, the plurality of signal lines form a grid for facilitating epitaxial growth of the semiconductor material. In the present disclosure, the plurality of micro LEDs are directly fabricated in an array substrate, obviating the complicated and error-prone transfer process.

Figure 1A:
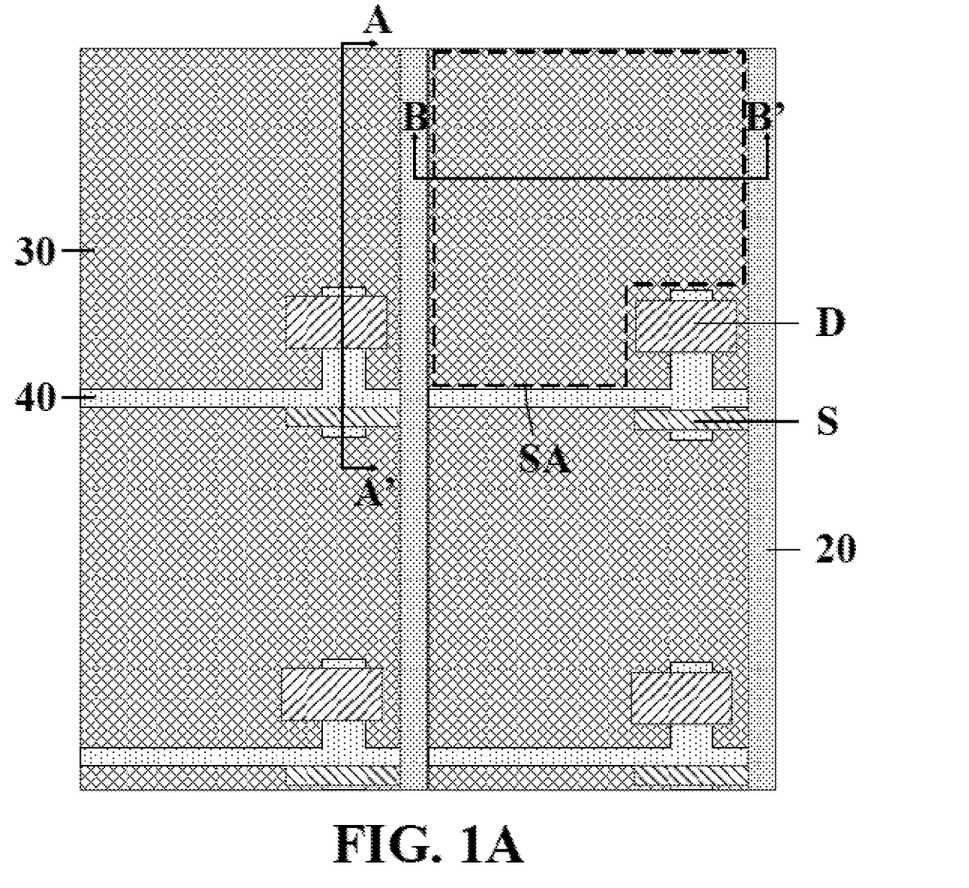
FIG. 1A is a plan view diagram illustrating an intermediate step of fabricating a micro LED array substrate in some embodiments according to the present disclosure.
Figures 1B, 1C:
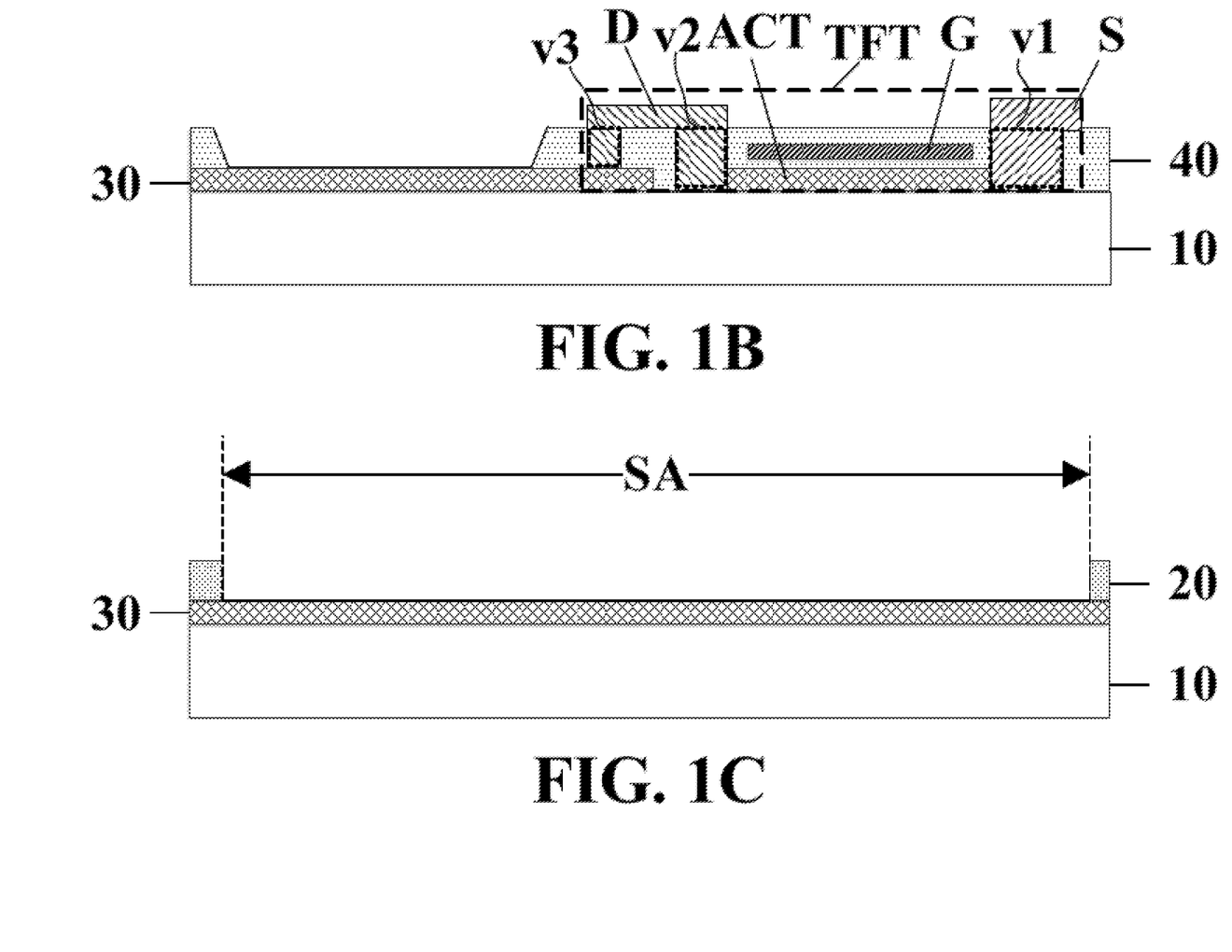
FIG. 1B is a cross-sectional view along an A-A' line in FIG. 1A.
FIG. 1C is a cross-sectional view along a B-B' line in FIG. 1A.

FIG. 1A is a plan view diagram illustrating an intermediate step of fabricating a micro LED array substrate in some embodiments according to the present disclosure. FIG. 1B is a cross-sectional view along an A-A' line in FIG. 1A. FIG. 1C is a cross-sectional view along a B-B' line in FIG. 1A. Referring to FIGS. 1A to 1C, the method of fabricating a micro light emitting diode array substrate having a plurality of micro LEDs includes first forming a plurality of signal lines 20 on a base substrate 10.

In conventional fabrication methods of display panels, it is to be avoided to have exposed metallic signal lines when depositing semiconductor materials, to avoid contact between the signal lines and the semiconductor material. Typically, before depositing the semiconductor material, an insulating layer is first formed on the substrate to cover up the signal lines so that they are not exposed during the deposition of the semiconductor material. It is discovered in the present disclosure, when depositing a semiconductor material for forming a semiconductor layer of the plurality of micro LEDs, the plurality of signal lines 20 form a grid that can facilitate epitaxial growth of the semiconductor material. Specifically, the epitaxial growth of the semiconductor material is promoted by the grid of the plurality of signal lines 20 to have a certain lattice orientation. Moreover, the epitaxial growth of the semiconductor material in the grid of the plurality of signal lines 20 results in an inverted trapezoidal growth profile of the semiconductor material layer. The lattice orientation, in combination with the unique growth profile, leads to a significantly enhanced emission efficiency of the plurality of micro LEDs fabricated by the present method.

Various appropriate signal lines of the array substrate may be used as the grid for promoting epitaxial growth of the semiconductor material. Examples of appropriate signal lines include gate lines, data lines, common electrode signal lines (for providing a common voltage to common electrodes), touch signal lines, or any combination thereof. FIGS. A to 1C illustrate an example in which a plurality of data lines are used as the grid for promoting epitaxial growth of the semiconductor material.

Figure 2A:
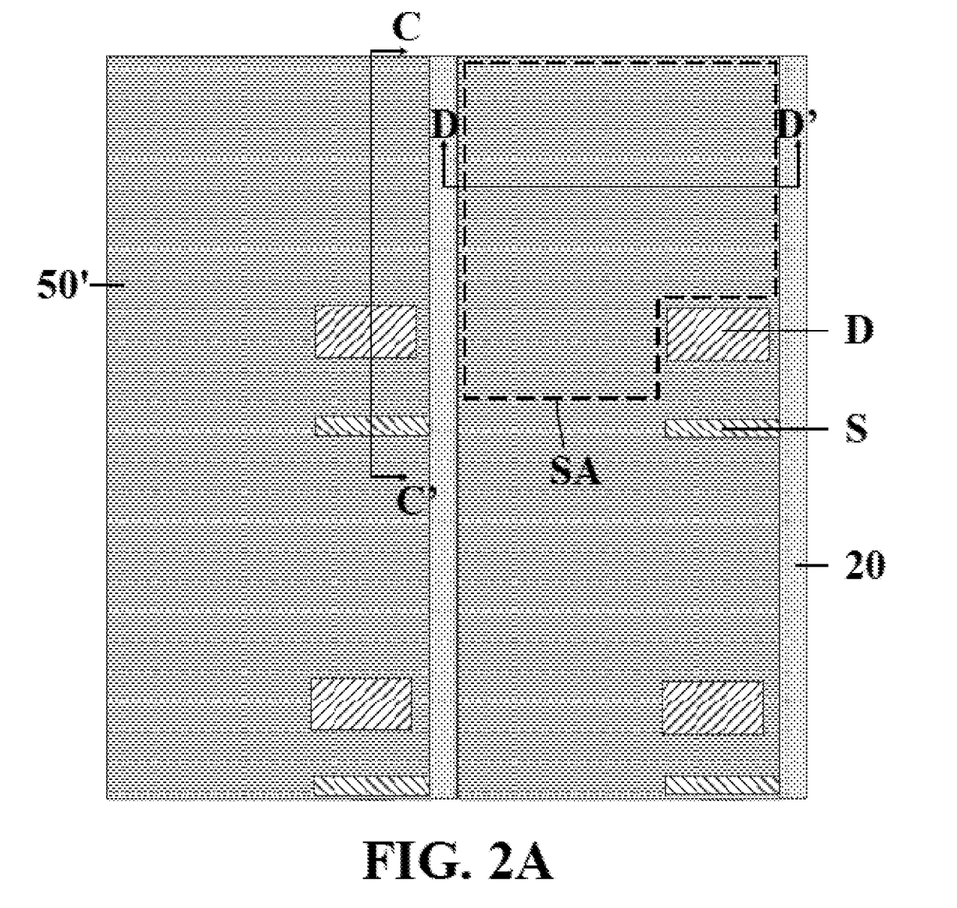
FIG. 2A is a plan view diagram illustrating an intermediate step of fabricating a micro LED array substrate in some embodiments according to the present disclosure.
Figure 2B:
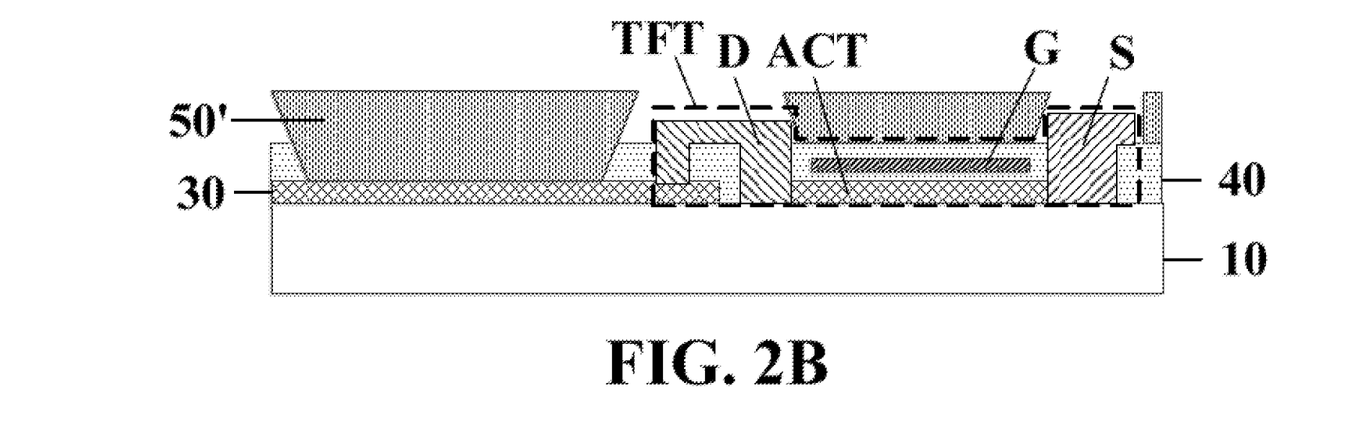
FIG. 2B is a cross-sectional view along a C-C' line in FIG. 2A.
Figure 2C:
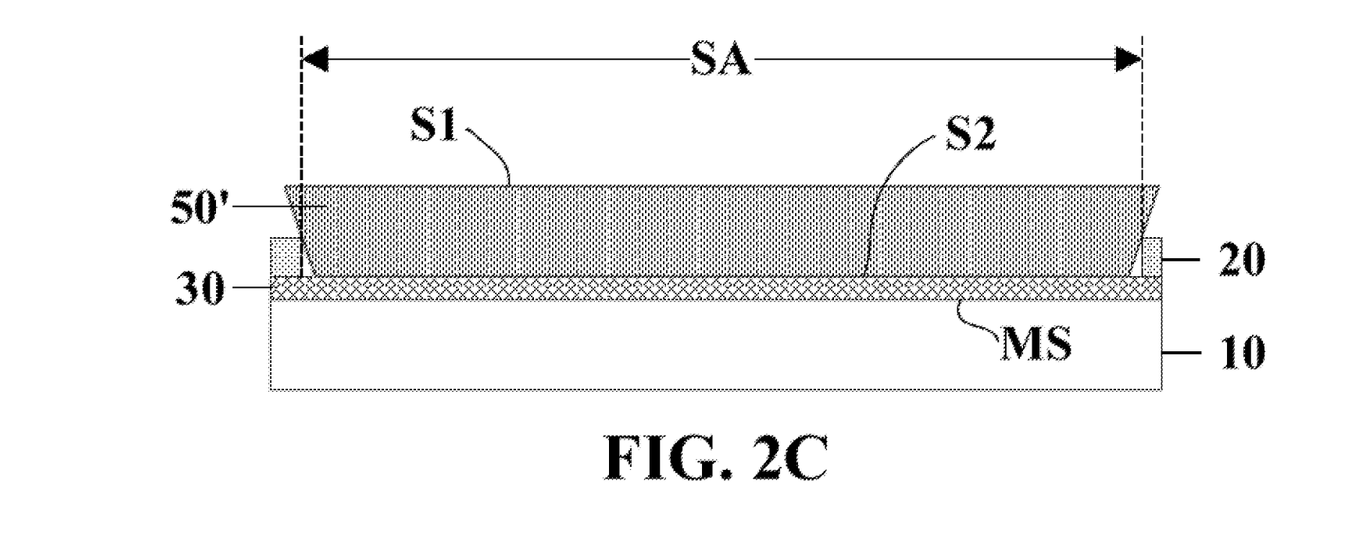
FIG. 2C is a cross-sectional view along a D-D' line in FIG. 2A.

FIG. 2A is a plan view diagram illustrating an intermediate step of fabricating a micro LED array substrate in some embodiments according to the present disclosure. FIG. 2B is a cross-sectional view along a C-C' line in FIG. 2A. FIG. 2C is a cross-sectional view along a D-D' line in FIG. 2A. Referring to FIGS. 2A to 2C, a semiconductor material is deposited on the base substrate 10 to form a semiconductor material layer 50'. As shown in FIG. 2C, a cross-section of the semiconductor material layer 50' along a plane perpendicular to a main surface MS of the base substrate 10 has an inverted trapezoidal shape. The cross-section has a first side S1 away from the base substrate 10 and a second side S2 opposite to the first side S1 and facing the base substrate 10. The first side S1 is wider than the second side S2 in each of a plurality of subpixel apertures SA. Each of the plurality of subpixel apertures SA corresponds to one of a plurality of subpixels in a display panel having the micro LED array substrate. For example, each of the plurality of subpixels in the display panel having the micro LED array substrate includes one of the plurality of micro LEDs, and each of the plurality of subpixel apertures SA is an aperture formed for depositing the semiconductor material of a respective one of the plurality of micro LEDs.

Referring to FIG. 2B and FIG. 2C, a surface of the plurality of signal lines 20 away from the base substrate 10 is uncovered during depositing the semiconductor material. The plurality of signal lines 20 form a grid for facilitating epitaxial growth of the semiconductor material.

In some embodiments, prior to depositing the semiconductor material, a growth layer is first formed on the base substrate 10 for epitaxial growth of the semiconductor material. Referring to FIGS. 1A to 1C, prior to forming the plurality of signal lines 20, a growth layer 30 is first formed on the base substrate 10. The epitaxial growth of the semiconductor material is formed on the growth layer 30. Various appropriate materials may be used for making the growth layer 30. Examples of appropriate growth layer materials include silicon, sapphire, quartz, GaN, SiC, and alumina. In one example, the growth layer 30 is made of a semiconductor material such as silicon.

In some embodiments, and referring to FIG. 1B, the method further includes forming a plurality of thin film transistors TFT on the base substrate 10 for respectively driving light emission of the plurality of micro LEDs. Each of the plurality of thin film transistors TFT is formed to include an active layer ACT, a gate electrode G, a source electrode S, and a drain electrode D.

In some embodiments, the growth layer 30 and the active layer ACT are formed in a same layer using a same material, and in a single patterning process using a single mask plate. As used herein, the term "same layer" refers to the relationship between the layers simultaneously formed in the same step. In one example, the growth layer 30 and the active layer ACT are in a same layer when they are formed as a result of one or more steps of a same patterning process performed in a same layer of material. In another example, the growth layer 30 and the active layer ACT can be formed in a same layer by simultaneously performing the step of forming the growth layer 30 and the step of forming the active layer ACT. The term "same layer" does not always mean that the thickness of the layer or the height of the layer in a cross-sectional view is the same.

When the growth layer 30 and the active layer ACT are formed in a same layer, optionally, the growth layer 30 is made of a semiconductor material, e.g., a same semiconductor material as the material for making the active layer ACT. In one example, the growth layer 30 and the active layer ACT are formed using a material including silicon, e.g., a polycrystalline silicon.

Referring to FIGS. 2A to 2C, the semiconductor material layer 50' can be a layer for making any semiconductor layer of the plurality of micro LEDs. For example, the semiconductor material layer 50' may be a layer for making an n-layer of the plurality of micro LEDs, and the semiconductor material for forming the semiconductor material layer 50' is an n-layer material such as n-GaN. In another example, the semiconductor material layer 50' is a layer for making a p-layer of the plurality of micro LEDs, and the semiconductor material for forming the semiconductor material layer 50' is a p-layer material such as p-GaN. In another example, the semiconductor material layer 50' is a layer for making a multiple quantum well layer of the plurality of micro LEDs, and the semiconductor material for forming the semiconductor material layer 50' is a quantum well material.

In some embodiments, the source electrode S, the drain electrode D, and the plurality of signal lines 20 are formed in a same layer using a same material, and in a single patterning process using a single mask plate. Optionally, the plurality of signal lines 20 are a plurality of data lines, which are formed in a same layer as the source electrode S and the drain electrode D. Various appropriate conductive materials and various appropriate fabricating methods may be used to make the source electrode S, the drain electrode D, and the plurality of signal lines 20. For example, a conductive material may be deposited on the substrate (e.g., by sputtering or vapor deposition); and patterned (e.g., by lithography such as a wet etching process) to form the source electrode S, the drain electrode D, and the plurality of signal lines 20. Examples of appropriate conductive materials for making the source electrode S, the drain electrode D, and the plurality of signal lines 20 include, but are not limited to, aluminum, tungsten, copper, and molybdenum, and alloys or laminates containing the same.

Referring to FIGS. 1A to 1C again, in some embodiments, the method further includes forming an insulating layer 40 on a side of the active layer ACT and the growth layer 30 away from the base substrate 10. For example, subsequent to forming the active layer ACT and the growth layer 30, and prior to forming the plurality of signal lines 20, the source electrode S, and the drain electrode D, an insulating material layer may be deposited on a side of the active layer ACT and the growth layer 30 away from the base substrate 10, followed by patterning the insulating material layer to form the plurality of subpixel apertures SA to expose a surface of the growth layer 30.

In some embodiments, the method further includes forming a first via v1, a second via v2, and a third via v3 respectively extending through the insulating layer 40. As shown in FIG. 1B, the source electrode S is formed to be connected to the active layer ACT through the first via v1; and the drain electrode D is formed to be connected to the active layer ACT through the second via v2 and connected to the growth layer 30 through the third via v3. A portion of the drain electrode D (e.g., the portion extending through the third via v3) may be considered as a contact pad of a respective one of the plurality of micro LEDs.

Figure 3A:
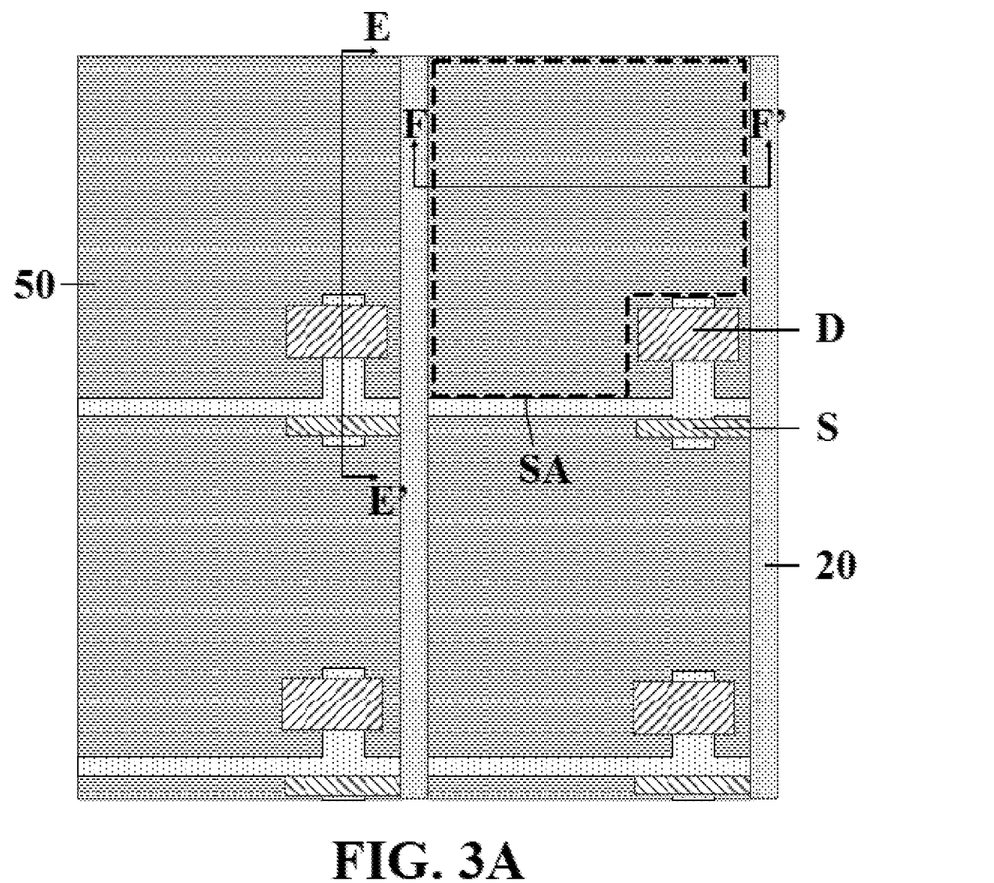
FIG. 3A is a plan view diagram illustrating an intermediate step of fabricating a micro LED array substrate in some embodiments according to the present disclosure.
Figure 3B:
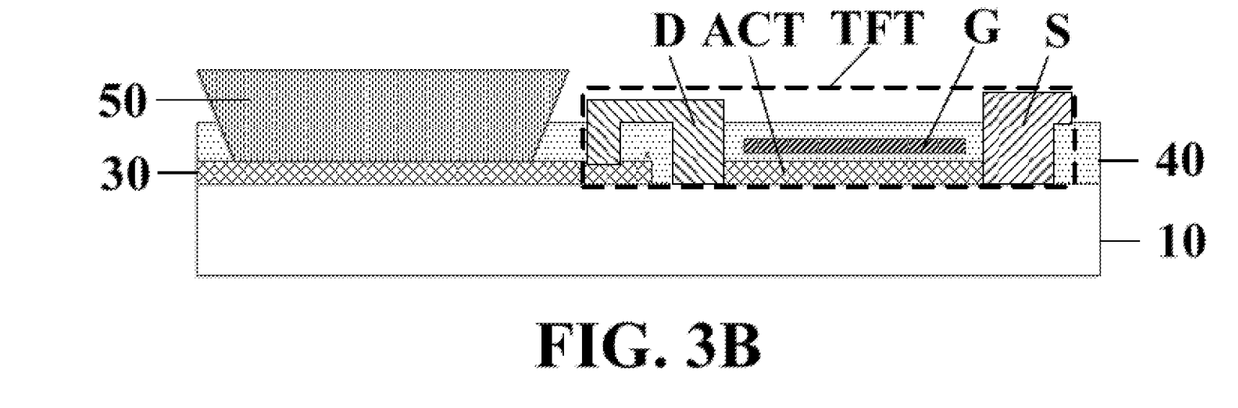
FIG. 3B is a cross-sectional view along an E-E' line in FIG. 2A.
Figure 3C:
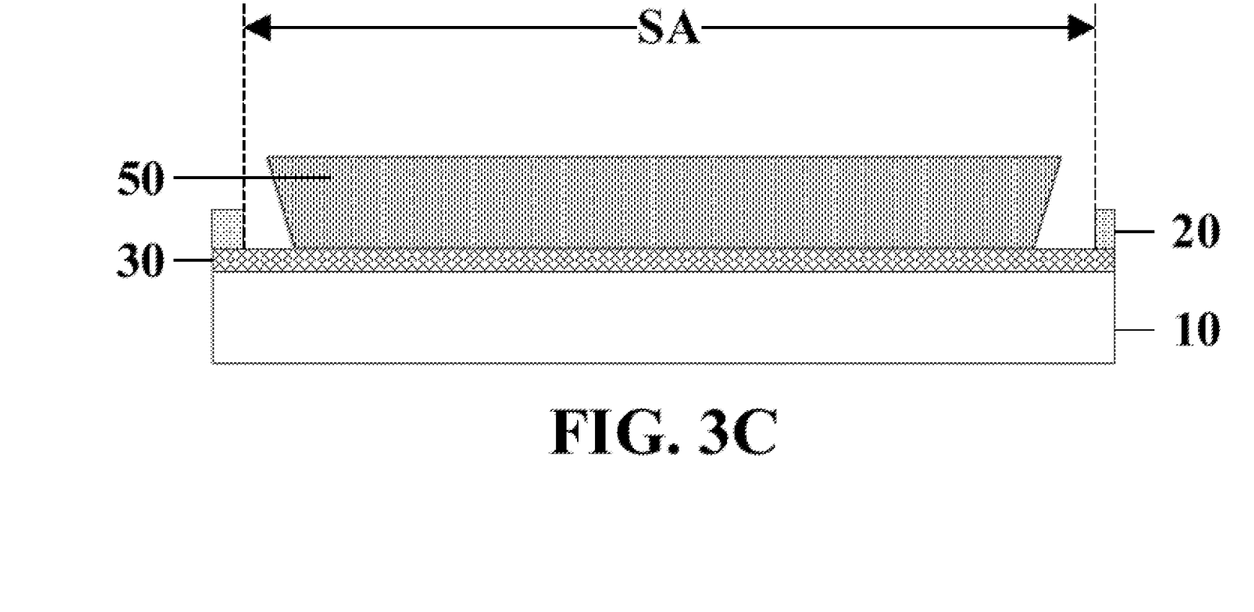
FIG. 3C is a cross-sectional view along an F-F' line in FIG. 2A.

FIG. 3A is a plan view diagram illustrating an intermediate step of fabricating a micro LED array substrate in some embodiments according to the present disclosure. FIG. 3B is a cross-sectional view along an E-E' line in FIG. 3A. FIG. 3C is a cross-sectional view along an F-F' line in FIG. 3A. Referring to FIGS. 3A to 3C, the method in some embodiments further includes patterning the semiconductor material layer to form a semiconductor layer 50 of the plurality of micro LEDs. The semiconductor layer 50 can be any semiconductor layer of the plurality of micro LEDs. For example, the semiconductor layer 50 may be an n-layer of the plurality of micro LEDs, and the semiconductor material for forming the semiconductor layer 50 is an n-layer material such as n-GaN. In another example, the semiconductor layer 50 is a p-layer of the plurality of micro LEDs, and the semiconductor material for forming the semiconductor layer 50 is a p-layer material such as p-GaN. In another example, the semiconductor layer 50 is a multiple quantum well layer of the plurality of micro LEDs, and the semiconductor material for forming the semiconductor layer 50 is a quantum well material.

Referring to FIG. 2C and FIG. 3C, during the patterning step, the semiconductor material layer 50' can be patterned so that the semiconductor layer 50 is spaced apart from the plurality of signal lines 20, thereby insulating the semiconductor layer 50 from the adjacent signal lines of the plurality of signal lines 20. Referring to FIG. 2B and FIG. 3B, any portion of the semiconductor material layer 50' outside the plurality of subpixel apertures SA can also be removed during the patterning process. For example, the semiconductor material deposited on a side of insulating layer 40 away from the active layer ACT and in a region between the source electrode S and the drain electrode D can be removed during the patterning process. Subsequent to the patterning step, only the semiconductor material in the plurality of subpixel apertures SA remains.

Figure 4:
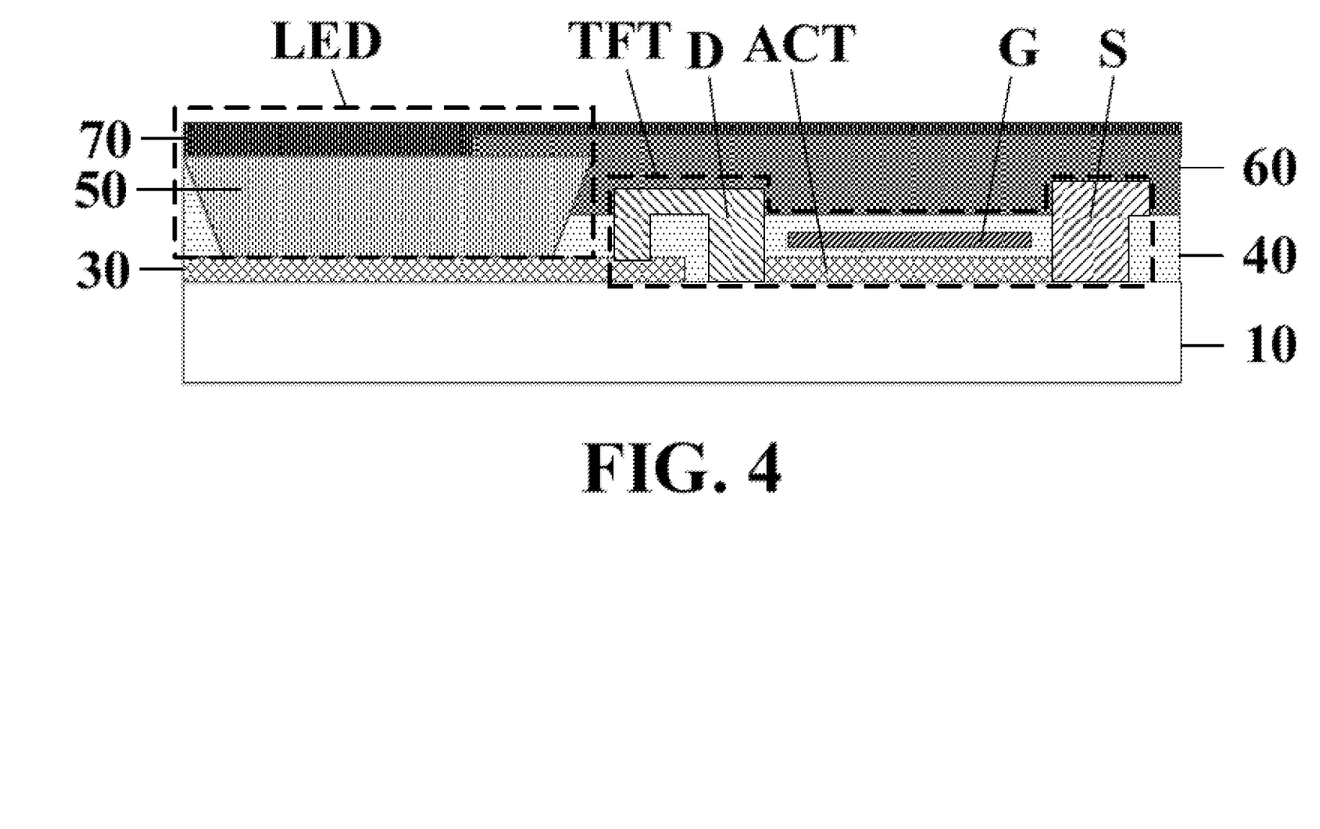
FIG. 4 is a cross-sectional view diagram illustrating a step of fabricating a micro LED array substrate in some embodiments according to the present disclosure.

FIG. 4 is a cross-sectional view diagram illustrating a step of fabricating a micro LED array substrate in some embodiments according to the present disclosure. Referring to FIG. 4, the method in some embodiments further includes forming a pixel definition layer 60 defining the plurality of subpixel apertures SA. The pixel definition layer 60 is formed on a side of the plurality of signal lines 20 away from the base substrate 10. Optionally, a portion of the pixel definition layer 60 is formed on a side of an edge portion of the semiconductor layer 50 away from the base substrate 10.

In some embodiments, the method further includes forming a contact pad layer 70 on a side of the semiconductor layer 50 away from the base substrate 10. Optionally, the contact pad layer 70 is a n-contact pad layer. Optionally, the contact pad layer 70 is a p-contact pad layer.

Figure 5:
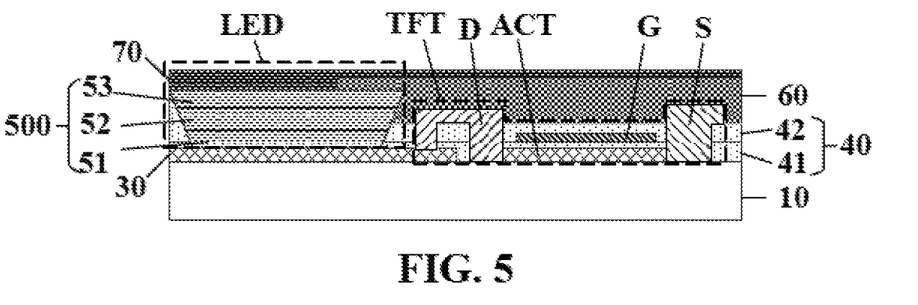
FIG. 5 is a schematic diagram illustrating the structure of a micro LED array substrate in some embodiments according to the present disclosure.

In another aspect, the present disclosure provides a micro light emitting diode array substrate having a plurality of micro LEDs. FIG. 5 is a schematic diagram illustrating the structure of a micro LED array substrate in some embodiments according to the present disclosure. Referring to FIG. 5, the micro LED array substrate in some embodiments includes a base substrate 10; a growth layer 30 on the base substrate 10; a plurality of semiconductor layers 500 of the plurality of micro LEDs on a side of the growth layer 30 away from the base substrate 10; and a plurality of thin film transistors TFT on the base substrate 10. Each of the plurality of thin film transistors TFT includes an active layer ACT. Optionally, the growth layer 30 and the active layer ACT are in a same layer and includes a same semiconductor material. Optionally, the growth layer 30 and the active layer ACT include silicon, e.g., a polycrystalline silicon.

Optionally, the plurality of semiconductor layers 500 includes a n-layer 51, a multiple quantum wells layer 52, and a p-layer 53.

In some embodiments, referring to FIG. 3A and FIG. 5, the micro LED array substrate further includes an insulating layer 40 on a side of the growth layer 30 and the active layer ACT away from the base substrate 10; and a plurality of signal lines 20 on a side of the insulating layer 40 away from the base substrate 10.

Optionally, the insulating layer 40 includes multiple layers. Referring to FIG. 5, in some embodiments, the insulating layer 40 includes a first insulating layer 41 and a second insulating layer 42. The first insulating layer 41 is between the active layer ACT and a gate electrode G of a respective one of the plurality of thin film transistors TFT. The second insulating layer 42 is on a side of the gate electrode G away from the base substrate 10.

In some embodiments, each of the plurality of thin film transistors TFT includes a source electrode S and a drain electrode D. Optionally, the source electrode S, the drain electrode D, and the plurality of signal lines 20 are in a same layer and include a same material such as aluminum. Optionally, the plurality of signal lines 20 are a plurality of data lines of the micro LED array substrate.

In some embodiments, the micro LED array substrate includes a first via v1, a second via v2, and a third via v3 respectively extending through the insulating layer 40. The source electrode S is connected to the active layer ACT through the first via v1. The drain electrode D is connected to the active layer ACT through the second via v2 and connected to the growth layer 30 through the third via v3. A portion of the drain electrode D (e.g., the portion extending through the third via v3) may be considered as a contact pad of a respective one of the plurality of micro LEDs.

In some embodiments, referring to FIG. 3A and FIG. 5, the micro LED array substrate further includes a pixel definition layer 60 defining a plurality of subpixel apertures SA on a side of the plurality of signal lines 20 away from the base substrate 10. In some embodiments, the pixel definition layer 60 is in direct contact with at least one of the plurality of semiconductor layers 500 of the plurality of micro LEDs; and the pixel definition layer 60 is in direct contact with the plurality of signal lines 20. For example, the pixel definition layer 60 is in direct contact with a p-layer 53 of the plurality of semiconductor layers 500. In another example, the pixel definition layer 60 is in direct contact with a lateral side of at least one of the plurality of semiconductor layers 500. Optionally, a portion of the pixel definition layer 60 is formed on a side of an edge portion of the plurality of semiconductor layers 500 away from the base substrate 10, an orthographic projection of the pixel definition layer 60 on the base substrate 10 overlaps with an orthographic projection of the edge portion of the plurality of semiconductor layers 500 on the base substrate 10. Optionally, an upper surface of the plurality of signal lines 20 away from the base substrate 10 are in direct contact with the pixel definition layer 60; and an upper most surface of the plurality of semiconductor layers 500 of the plurality of micro LEDs is in direct contact with the pixel definition layer 60.

Figure 6:
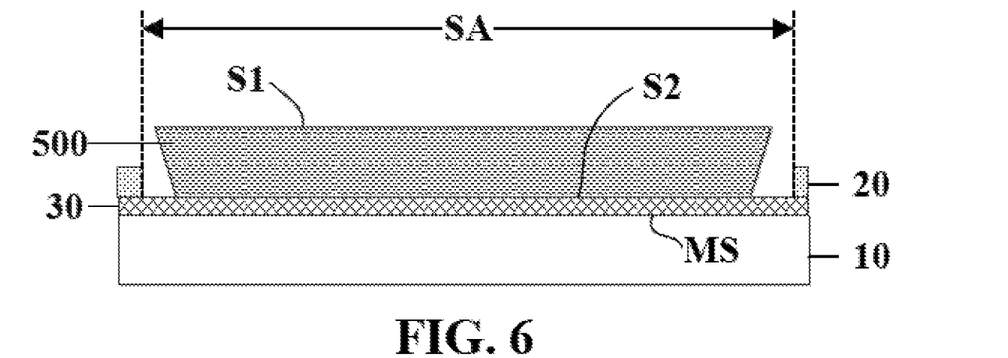
FIG. 6 is a cross-sectional view of a micro LED array substrate in some embodiments according to the present disclosure.

FIG. 6 is a cross-sectional view of a micro LED array substrate in some embodiments according to the present disclosure. Referring to FIG. 6, in some embodiments, the plurality of semiconductor layers 500 in each of the plurality of subpixel apertures SA has a cross-section along a plane perpendicular to a main surface MS of the base substrate 10. The cross-section has a first side S1 away from the base substrate 10 and a second side S2 opposite to the first side S1 and facing the base substrate 10. Optionally, the first side S1 is wider than the second side S2 in each of the plurality of subpixel apertures SA. Optionally, the cross-section has an inverted trapezoidal shape.

Referring to FIG. 5, in some embodiments, the micro LED array substrate further includes a contact pad layer 70 on a side of the plurality of semiconductor layers 500 away from the base substrate 10. Optionally, the contact pad layer 70 is a n-contact pad layer. Optionally, the contact pad layer 70 is a p-contact pad layer.

Figure 7:
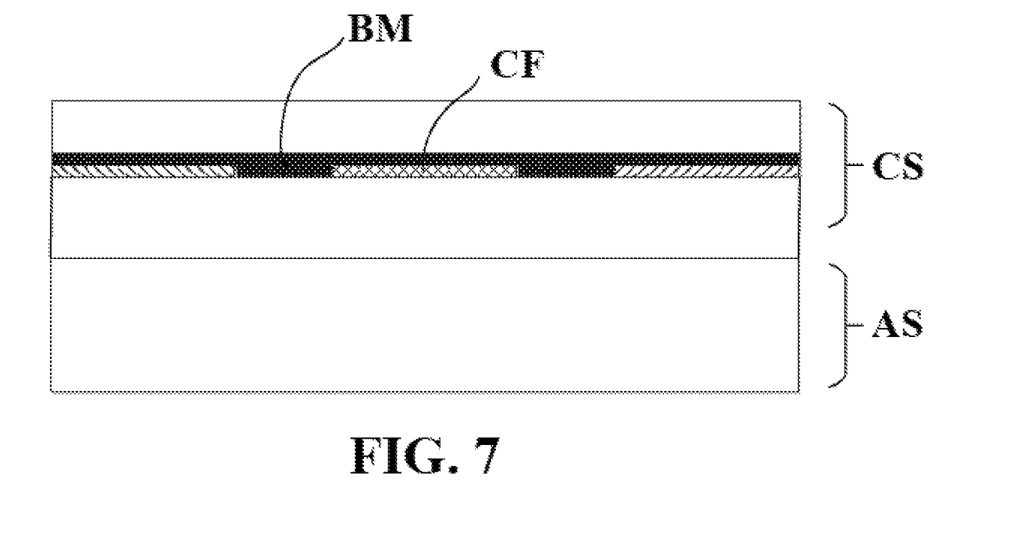
FIG. 7 is a schematic diagram illustrating the structure of a micro LED display panel in some embodiments according to the present disclosure.

In another aspect, the present disclosure provides a micro light emitting diode display panel having the micro light emitting diode array substrate described herein or fabricated by a method described herein. FIG. 7 is a schematic diagram illustrating the structure of a micro LED display panel in some embodiments according to the present disclosure. Referring to FIG. 7, the micro light emitting diode display panel in some embodiments includes a micro light emitting diode array substrate AS and a counter substrate CS assembled together. Optionally, the counter substrate CS includes a color filter CF and a black matrix BM.

In another aspect, the present disclosure provides a micro light emitting diode display apparatus having the micro light emitting diode display panel described herein or fabricated by a method described herein. Optionally, the micro light emitting diode display apparatus further includes one or more integrated circuits connected to the micro LED array substrate. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a micro light emitting diode (micro LED) array substrate having a plurality of micro LEDs, comprising:
   forming a growth layer on a base substrate;
   forming a plurality of signal lines on the base substrate;
   depositing a semiconductor material on the base substrate to form a semiconductor material layer; and
   patterning the semiconductor material layer to form a semiconductor layer of the plurality of micro LEDs;
   wherein a surface of the plurality of signal lines away from the base substrate is uncovered during depositing the semiconductor material, the plurality of signal lines forming a grid for facilitating epitaxial growth of the semiconductor material; and
   the epitaxial growth of the semiconductor material being formed in direct contact with the growth layer.

2. The method of claim 1, further comprising forming a plurality of thin film transistors on the base substrate for respectively driving light emission of the plurality of micro LEDs;
   wherein each of the plurality of thin film transistors is formed to comprise an active layer; and
   the growth layer and the active layer are formed in a same layer using a same material, and in a single patterning process using a single mask plate.

3. The method of claim 2, wherein each of the plurality of thin film transistors is formed to comprises a source electrode and a drain electrode; and
   the source electrode, the drain electrode, and the plurality of signal lines are formed in a same layer using a same material, and in a single patterning process using a single mask plate.

4. The method of claim 3, subsequent to forming the active layer and the growth layer and prior to forming the plurality of signal lines, the source electrode, and the drain electrode, further comprising:
   forming an insulating layer on a side of the active layer and the growth layer away from the base substrate; and
   forming a first via, a second via, and a third via respectively extending through the insulating layer;
   wherein the source electrode is formed to be connected to the active layer through the first via; and the drain electrode is formed to be connected to the active layer through the second via and connected to the growth layer through the third via.

5. The method of claim 2, wherein the growth layer and the active layer are formed using a material comprising silicon.

6. The method of claim 1, subsequent to patterning the semiconductor material layer to form the semiconductor layer of the plurality of micro LEDs, further comprising forming a pixel definition layer defining a plurality of subpixel apertures; and
   forming a contact pad layer on a side of the semiconductor layer away from the base substrate.

7. The method of claim 1, wherein the plurality of signal lines are a plurality of data lines of the micro LED array substrate, the plurality of data lines connected to source electrodes of a plurality of thin film transistors, respectively.

8. The method of claim 1, wherein the semiconductor layer of the plurality of micro LEDs is selected from a group consisting of an n-layer, a p-layer, and a multiple quantum well layer of the plurality of micro LEDs.

9. A micro light emitting diode (micro LED) array substrate having a plurality of micro LEDs, comprising:
 a base substrate;
 a growth layer on the base substrate;
 a plurality of semiconductor layers of the plurality of micro LEDs on a side of the growth layer away from the base substrate, and in direct contact with the growth layer; and
 a plurality of thin film transistors on the base substrate;
 wherein each of the plurality of thin film transistors comprises an active layer; and
 the growth layer and the active layer are in a same layer and comprise a same semiconductor material.

10. The micro LED array substrate of claim 9, further comprising:
 an insulating layer on a side of the growth layer and the active layer away from the base substrate; and
 a plurality of signal lines on a side of the insulating layer away from the base substrate.

11. The micro LED array substrate of claim 10, wherein each of the plurality of thin film transistors comprises a source electrode and a drain electrode; and
 the source electrode, the drain electrode, and the plurality of signal lines are in a same layer and comprise a same material.

12. The micro LED array substrate of claim 11, further comprising a first via, a second via, and a third via respectively extending through the insulating layer;
 wherein the source electrode is connected to the active layer through the first via; and the drain electrode is connected to the active layer through the second via and connected to the growth layer through the third via.

13. The micro LED array substrate of claim 10, further comprising a pixel definition layer defining a plurality of subpixel apertures on a side of the plurality of signal lines away from the base substrate, the plurality of semiconductor layers being in the plurality of subpixel apertures;
 wherein the pixel definition layer is in direct contact with at least one of the plurality of semiconductor layers of the plurality of micro LEDs; and
 the pixel definition layer is in direct contact with the plurality of signal lines.

14. The micro LED array substrate of claim 13, wherein an upper surface of the plurality of signal lines away from the base substrate are in direct contact with the pixel definition layer; and
 an upper most surface of the plurality of semiconductor layers of the plurality of micro LEDs is in direct contact with the pixel definition layer.

15. The micro LED array substrate of claim 13, wherein the plurality of semiconductor layers in each of the plurality of subpixel apertures has a cross-section along a plane perpendicular to a main surface of the base substrate;
 the cross-section has a first side away from the base substrate and a second side opposite to the first side and facing the base substrate; and
 the first side is wider than the second side in each of the plurality of subpixel apertures.

16. The micro LED array substrate of claim 13, further comprising a contact pad layer on a side of the plurality of semiconductor layers away from the base substrate.

17. The micro LED array substrate of claim 9, wherein the growth layer and the active layer comprise a material comprising silicon.

18. The micro LED array substrate of claim 9, wherein the plurality of signal lines are a plurality of data lines of the micro LED array substrate.

19. A micro light emitting diode (micro LED) display apparatus, comprising the micro LED array substrate of claim 9, and one or more integrated circuits connected to the micro LED array substrate.

* * * * *